(12) United States Patent
Zhai et al.

(10) Patent No.: US 12,727,119 B2
(45) Date of Patent: Sep. 1, 2026

(54) RELAY STATION SYSTEM FOR LONG-DISTANCE SUBMARINE SUPERCONDUCTING CABLE

(71) Applicant: HUNAN UNIVERSITY, Changsha City (CN)

(72) Inventors: Yujia Zhai, Changsha City (CN); Xingzheng Wu, Changsha City (CN); Ying Xin, Changsha City (CN); Liufei Shen, Changsha City (CN); Litong Zhu, Changsha City (CN); Jinduo Wang, Changsha City (CN); Zhiqiang Zheng, Changsha City (CN); Shoudao Huang, Changsha City (CN)

(73) Assignee: HUNAN UNIVERSITY, Changsha City (CN)

( * ) Notice: Subject to any disclaimer, the term of this patent is extended or adjusted under 35 U.S.C. 154(b) by 204 days.

(21) Appl. No.: 18/818,393

(22) Filed: Aug. 28, 2024

(65) Prior Publication Data

US 2026/0013078 A1 Jan. 8, 2026

(30) Foreign Application Priority Data

Jul. 4, 2024 (CN) ........................ 202410896164.0

(51) Int. Cl.
*H05K 7/20* (2006.01)
*H01B 11/22* (2006.01)
*H01B 12/16* (2006.01)
*H02B 7/08* (2006.01)

(52) U.S. Cl.
CPC ......... *H05K 7/20281* (2013.01); *H01B 11/22* (2013.01); *H01B 12/16* (2013.01); *H02B 7/08* (2013.01)

(58) Field of Classification Search
CPC ..... H05K 7/20281; H01B 11/22; H01B 12/16
USPC ...................................................... 174/125.1
See application file for complete search history.

(56) References Cited

U.S. PATENT DOCUMENTS

2001/0028773 A1* 10/2001 Kato .................. G02B 6/03666 385/109
2012/0230679 A1* 9/2012 Hayashi ............. H04B 10/5051 398/28

* cited by examiner

*Primary Examiner* — Andargie M Aychillhum
(74) *Attorney, Agent, or Firm* — James F. Lea, III; Gable Gotwals

(57) ABSTRACT

Provided is a relay station system for a long-distance submarine superconducting cable, which relates to the field of relay stations. The relay station system is used for a submarine superconducting cable. The submarine cable housing is partially stripped, creating three transmission segments. The relay station system includes a shaft-type operation and maintenance platform, a refrigeration station, and a coolant circulation device. The coolant circulation device includes an inflow cooling pipe, an outflow cooling pipe, two refrigerant storage tanks, and two intermediate cooling pipes. The refrigeration station is in the second refrigerant storage tank. Refrigerant from the first transmission segment and storage tank enters the second tank, cools, and moves to the third segment and first tank. This application addresses refrigeration and relay issues for long-distance submarine superconducting cables, facilitating operation and maintenance, including for seabed-laid cables and other relay signal devices, while reducing overall maintenance costs.

10 Claims, 3 Drawing Sheets

RELAY STATION SYSTEM FOR LONG-DISTANCE SUBMARINE SUPERCONDUCTING CABLE

CROSS REFERENCE TO RELATED APPLICATION

This patent application claims the benefit and priority of Chinese Patent Application No. 2024108961640, filed with the China National Intellectual Property Administration on Jul. 4, 2024, the disclosure of which is incorporated by reference herein in its entirety as part of the present application.

TECHNICAL FIELD

The present disclosure relates to the field of relay stations, and in particular to a relay station system for a long-distance submarine superconducting cable.

BACKGROUND

With the increasing demand for electricity in the society, there are greater challenges for conventional power transmission systems. In this case, as a new power transmission technology, due to a low loss, a large capacity, and a small volume, superconducting cables become a potential solution to resolve problems of long-distance and large-capacity power transmission. Green, environmental protection, low-carbon, large-capacity, and low-loss power transmission can be implemented by a superconducting power transmission technology.

Due to features of superconducting materials, the superconducting cables need to operate in a low-temperature environment. At present, short-distance power transmission is implemented through the superconducting cables. This is because the superconducting cables are used for long-distance transmission, and at a relatively high external ambient temperature/heat leakage, the low-temperature environment and superconducting statuses cannot be maintained. Therefore, refrigeration for long-distance submarine superconducting cables has become an urgent problem to be resolved at present.

SUMMARY

In view of the above problems in the art, an objective of the present disclosure is to provide a relay station system for a long-distance submarine superconducting cable, to resolve refrigeration for the long-distance submarine superconducting cable.

In order to solve the above technical problem, the technical solution used by the present disclosure is as follows:

A relay station system for a long-distance submarine superconducting cable, where the relay station system is used for a submarine superconducting cable;

the submarine superconducting cable includes a housing and a cable body that is disposed in the housing; a cable cooling channel is disposed between the housing and the cable body; the cable cooling channel is configured to introduce a refrigerant; relay station systems are provided and spaced apart at a specific distance for the submarine superconducting cable; one of the relay station systems corresponds to a segment of the submarine superconducting cable; a housing of the segment of the submarine superconducting cable is partially stripped, to form a first transmission segment, a second transmission segment, and a third transmission segment; and the second transmission segment is the segment of the submarine superconducting cable of which the housing is stripped;

the relay station system includes: a shaft-type operation and maintenance platform, a refrigeration station, and a coolant circulation device; and the refrigeration station and the coolant circulation device are carried inside the shaft-type operation and maintenance platform;

the coolant circulation device includes: an inflow cooling pipe, an outflow cooling pipe, a first refrigerant storage tank, a second refrigerant storage tank, a first intermediate cooling pipe, and a second intermediate cooling pipe;

the first refrigerant storage tank is located outside the second transmission segment; the first refrigerant storage tank is configured to provide the refrigerant for the second transmission segment; the first refrigerant storage tank is connected to an input of the second refrigerant storage tank through the first intermediate cooling pipe; a cable cooling channel of the first transmission segment is connected to the inflow cooling pipe; the inflow cooling pipe is connected to the second refrigerant storage tank; the second refrigerant storage tank is connected to a cable cooling channel of the third transmission segment through the outflow cooling pipe; the second refrigerant storage tank is connected to the first refrigerant storage tank through the second intermediate cooling pipe; and the refrigeration station is located in the second refrigerant storage tank;

a refrigerant in the cable cooling channel of the first transmission segment enters the second refrigerant storage tank through the inflow cooling pipe, and after being cooled by the refrigeration station, the refrigerant enters the cable cooling channel of the third transmission segment through the outflow cooling pipe; and a refrigerant in the first refrigerant storage tank enters the second refrigerant storage tank through the first intermediate cooling pipe, and after being cooled by the refrigeration station, the refrigerant enters the first refrigerant storage tank through the second intermediate cooling pipe.

Optionally, the coolant circulation device further includes: a first temperature sensor, a first refrigerant pump, and a temperature control module; and the first temperature sensor and the first refrigerant pump are both connected to the temperature control module;

the first temperature sensor and the first refrigerant pump are both disposed in the first refrigerant storage tank; and the first temperature sensor is configured to monitor a temperature of the refrigerant in the first refrigerant storage tank; and the temperature control module is configured to control a pumping flow of the first refrigerant pump based on the temperature of the refrigerant monitored by the first temperature sensor, to maintain the temperature of the refrigerant in the first refrigerant storage tank in a specific temperature range.

Optionally, the coolant circulation device further includes: a second temperature sensor; the second temperature sensor is disposed in the second refrigerant storage tank; and the second temperature sensor and the refrigeration station are both connected to the temperature control module; and the second temperature sensor is configured to monitor a temperature of the refrigerant in the second refrigerant storage tank; and the temperature control module is further configured to control power of the refrigeration station based on the temperature of the refrigerant monitored by the second temperature sensor, to enable the temperature of the refrigerant in the second refrigerant storage tank to be smaller than a specific temperature value.

Optionally, the coolant circulation device further includes: a first flow sensor, a second flow sensor, a second refrigerant pump, and a flow adjustment module; the first flow sensor is disposed on the cable cooling channel of the first transmission segment; the second flow sensor is disposed on the cable cooling channel of the third transmission segment; the second refrigerant pump is disposed in the second refrigerant storage tank; and the second flow sensor and the second refrigerant pump are both connected to the flow adjustment module;

the first flow sensor is configured to monitor a refrigerant inflow flow of the cable cooling channel of the first transmission segment; and the second flow sensor is configured to monitor a refrigerant outflow flow of the cable cooling channel of the third transmission segment; and the flow adjustment module is configured to control a pumping flow of the second refrigerant pump based on the refrigerant inflow flow, to balance the refrigerant inflow flow and the refrigerant outflow flow.

Optionally, the relay station system further includes: a monitoring protection and processing system and a signal station; the signal station is connected to the monitoring protection and processing system; and the monitoring protection and processing system is connected to the cable body; and the monitoring protection and processing system is configured to receive an optical fiber signal sent by the cable body; and the signal station is configured to feed back the optical fiber signal to a terminal or an adjacent relay station system.

Optionally, the shaft-type operation and maintenance platform is provided with a first overhaul channel and a second overhaul channel; the first overhaul channel is located below a sea surface; and the second overhaul channel is located above the sea surface;

the first overhaul channel is used for an overhaul drone to overhaul an exterior and interior of the shaft-type operation and maintenance platform; and the second overhaul channel is used for operation and maintenance personnel to enter the shaft-type operation and maintenance platform for overhaul.

Optionally, the inflow cooling pipe includes a first straight channel segment, a first curved channel segment, and a connection channel segment; and the outflow cooling pipe includes a second straight channel segment and a second curved channel segment;

the first straight channel segment is connected to the first curved channel segment; the first curved channel segment is connected to the second curved channel segment; the second curved channel segment is connected to the second straight channel segment; the first curved channel segment and the second curved channel segment form a semicircular channel; and the first straight channel segment is connected to the second refrigerant storage tank through the connection channel segment; and the cable cooling channel of the first transmission segment is connected to the first straight channel segment; and the second refrigerant storage tank is connected to the cable cooling channel of the third transmission segment through the second straight channel segment.

Optionally, the coolant circulation device further includes: a first air valve and a second air valve;

the first air valve is disposed on the first curved channel segment, and the second air valve is disposed at a top of the second refrigerant storage tank; and the first air valve is configured to adjust an air pressure in the first straight channel segment; and the second air valve is configured to adjust an air pressure in the second refrigerant storage tank.

Optionally, the coolant circulation device further includes: an energy dissipation orifice plate; and the energy dissipation orifice plate is disposed inside the second straight channel segment.

Optionally, the relay station system further includes: a compartment; the compartment is disposed at the first overhaul channel; and the compartment is used for the overhaul drone to overhaul the exterior and interior of the shaft-type operation and maintenance platform.

According to specific embodiments provided by the present disclosure, the present disclosure provides the following technical effect. In embodiments of the present disclosure, the relay station systems are provided and spaced apart at the specific distance for the long-distance submarine superconducting cable, each relay station system includes the shaft-type operation and maintenance platform, the refrigeration station, and the coolant circulation device, the refrigeration station is disposed in the second refrigerant storage tank of the coolant circulation device, and the refrigerant medium in the cable cooling channel of the submarine superconducting cable segment corresponding to the relay station is cooled via the first refrigerant storage tank and the second refrigerant storage tank of the coolant circulation device. This ensures that the long-distance submarine superconducting cable can operate in a low-temperature environment, and resolves the refrigeration for the long-distance submarine superconducting cables.

BRIEF DESCRIPTION OF THE DRAWINGS

To describe the technical solutions in embodiments of the present disclosure or in the prior art more clearly, the accompanying drawings required for embodiments are briefly described below. Apparently, the accompanying drawings in the following description show merely some embodiments of the present disclosure, and those of ordinary skill in the art may still derive other accompanying drawings from these accompanying drawings without creative efforts.

REFERENCE NUMERALS

Figure 1:
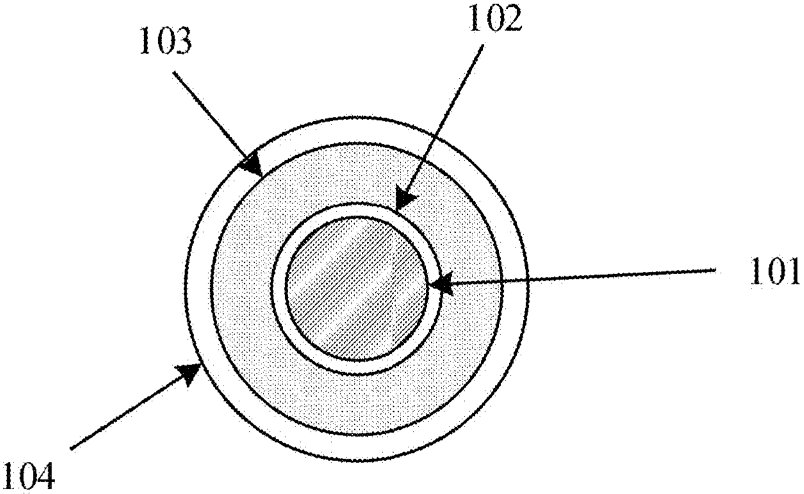
FIG. 1 is a schematic cross-sectional view of a superconducting cable according to an embodiment of the present disclosure.

101: cable core; 102: optical fiber; 103: refrigerant; 104: housing; 201: monitoring protection and processing system;

202: signal station; 203: first flow sensor; 204: second flow sensor; 205: first temperature sensor; 206: second temperature sensor; 301: first refrigerant storage tank; 302: second refrigerant storage tank; 303: refrigeration station; 304: second refrigerant pump; 305: first refrigerant pump; 401: first transmission segment; 402: first straight channel segment; 403: connection channel segment; 404: second straight channel segment; 405: second intermediate cooling pipe; 406: first intermediate cooling pipe; 407: third transmission segment; 501: sea surface; 502: control fluid level; 503: seabed; 601: shaft-type operation and maintenance platform; 602: ship; 603: overhaul drone; 604: first compartment; 605: second compartment; 606: first gate; 607: second gate; 608: first overhaul channel; 609: floating pontoon dock; 610: second overhaul channel; 611: climbing ladder; 701: sealing flange; 702: first air valve; 703: second air valve; 704: energy dissipation orifice plate.

DETAILED DESCRIPTION OF THE EMBODIMENTS

The technical solutions of embodiments of the present disclosure are clearly and completely described below with reference to the drawings in embodiments of the present disclosure. Apparently, the described embodiments are merely a part rather than all of embodiments of the present disclosure. All other embodiments obtained by a person of ordinary skill in the art based on embodiments of the present disclosure without creative efforts shall fall within the protection scope of the present disclosure.

At present, the development of superconducting cables is still in infancy. Existing superconducting cables are short, and a refrigeration relay station does not need to be disposed for maintaining a low-temperature environment required by superconducting cables. Research on the long-distance superconducting cables is relatively small, and there is a lack of relevant research on the refrigeration relay station maintaining the low-temperature environment required by the long-distance superconducting cables. Therefore, to implement commercial applications of the superconducting cables, it is necessary to resolve some technical difficulties such as research on the cooling and maintenance of the long-distance submarine superconducting cables, to maintain the low-temperature environment for the superconducting cables, and maintain superconducting states of the superconducting cables.

Based on the above description, an objective of the present disclosure is to provide a relay station system for a long-distance submarine superconducting cable, to resolve refrigeration for the long-distance submarine superconducting cable.

In order to make the above objective, features and advantages of the present disclosure clearer and more comprehensible, the present disclosure will be further described in detail below in combination with accompanying drawings and particular implementation modes.

Figure 2:
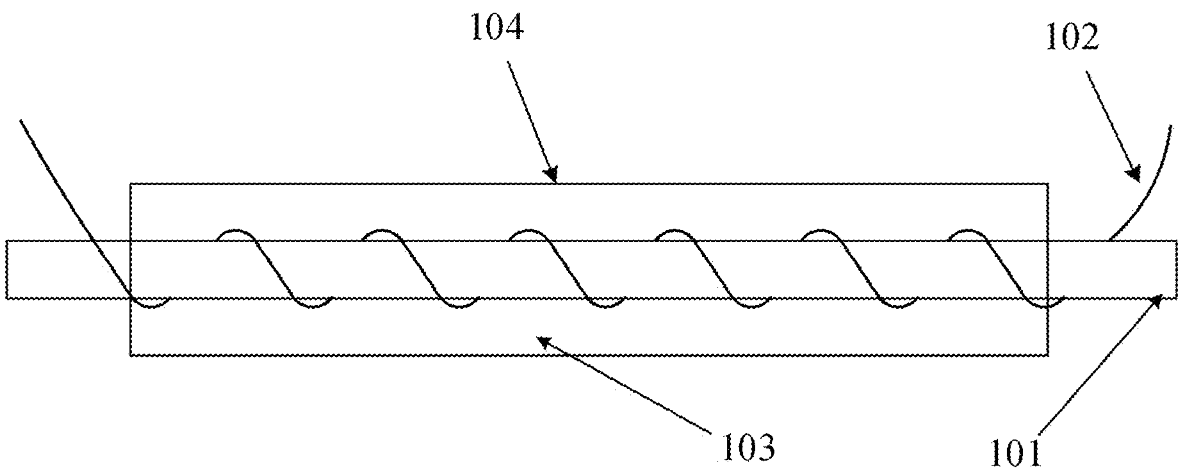
FIG. 2 is a schematic diagram of a structure of a superconducting cable according to an embodiment of the present disclosure.

FIG. 1 is a schematic cross-sectional view of a superconducting cable according to an embodiment of the present disclosure. FIG. 2 is a schematic diagram of a structure of a superconducting cable according to an embodiment of the present disclosure. As shown in FIG. 1 and FIG. 2, a submarine superconducting cable includes a cable body and a housing 104. The cable body includes a superconducting cable core 101 and an optical fiber 102. The optical fiber 102 is helically wrapped on the superconducting cable core 101. The cable body is disposed in the housing 104. A cable cooling channel is disposed between the housing 104 and the cable body. The cable cooling channel is configured to introduce a refrigerant (for example, liquid nitrogen). Relay station systems are provided and spaced apart at a specific distance (for example, 1 km to 20 km) for the submarine superconducting cable. A segment of the submarine superconducting cable that corresponds to the one relay station system is used as a segment of the submarine superconducting cable. A housing of the segment of the submarine superconducting cable is partially stripped, to form a first transmission segment 401, a second transmission segment, and a third transmission segment 407. The second transmission segment is the segment of the submarine superconducting cable of which the housing is stripped.

The following emphatically describes the relay station system for the submarine superconducting cable.

Figure 3:
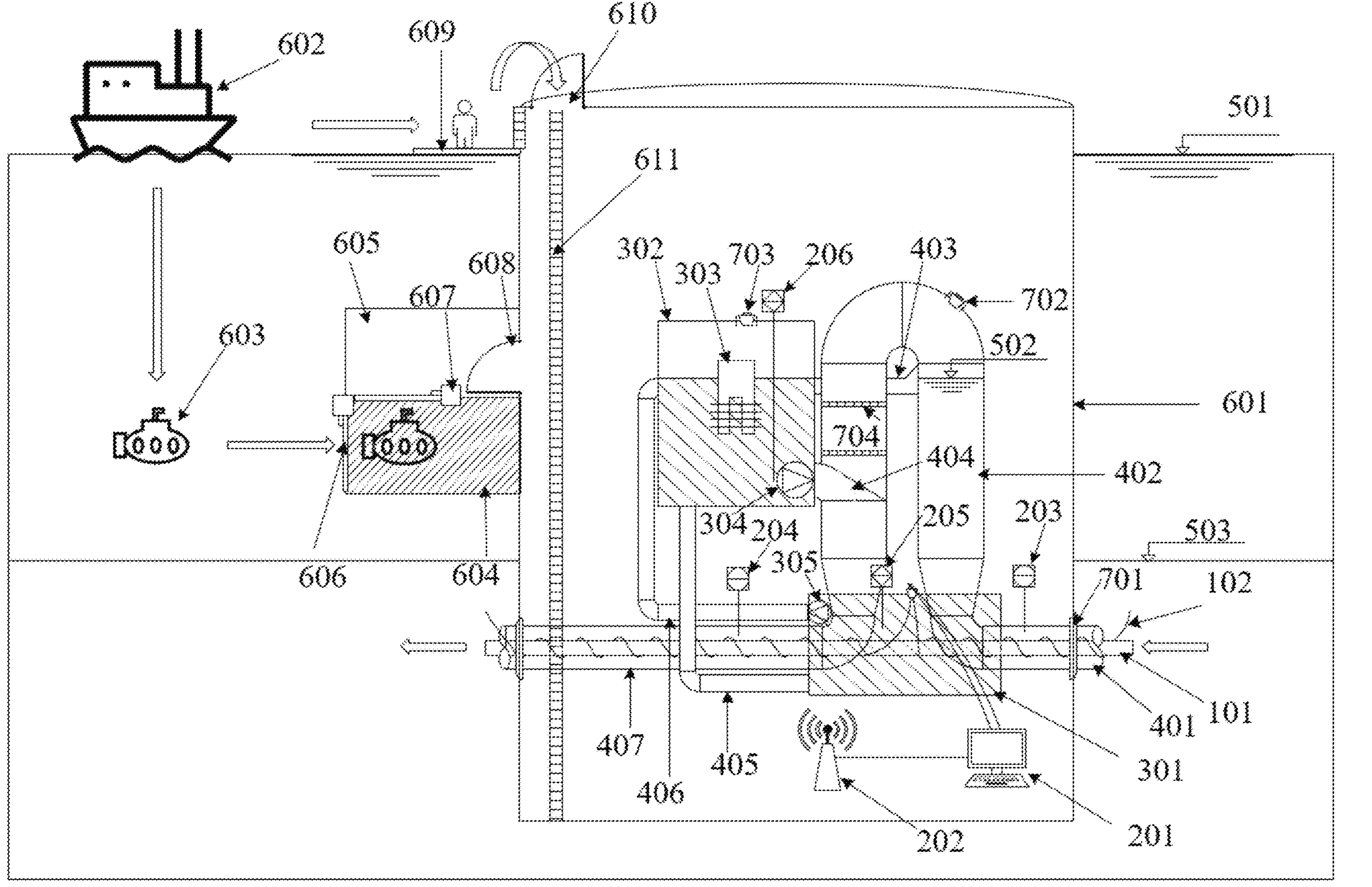
FIG. 3 is a schematic diagram of a structure of a relay station system for a long-distance submarine superconducting cable according to an embodiment of the present disclosure.

FIG. 3 is a schematic diagram of a structure of a relay station system for a long-distance submarine superconducting cable according to an embodiment of the present disclosure. As shown in FIG. 3, the relay station system includes: a shaft-type operation and maintenance platform 601, a refrigeration station 303, and a coolant circulation device. The refrigeration station 303 and the coolant circulation device are carried inside the shaft-type operation and maintenance platform 601. The submarine superconducting cable is laid beneath a seabed 503, and is connected to the shaft-type operation and maintenance platform 601 through a sealing flange 701.

The coolant circulation device includes: an inflow cooling pipe, an outflow cooling pipe, a first refrigerant storage tank 301, a second refrigerant storage tank 302, a first intermediate cooling pipe 406, and a second intermediate cooling pipe 405.

The first refrigerant storage tank 301 is located outside the second transmission segment. The first refrigerant storage tank 301 is configured to provide the refrigerant for the second transmission segment. The first refrigerant storage tank 301 is connected to an input of the second refrigerant storage tank 302 through the first intermediate cooling pipe 406. A cable cooling channel of the first transmission segment 401 is connected to the inflow cooling pipe. The inflow cooling pipe is connected to the second refrigerant storage tank 302. The second refrigerant storage tank 302 is connected to a cable cooling channel of the third transmission segment 407 through the outflow cooling pipe. The second refrigerant storage tank 302 is connected to the first refrigerant storage tank 301 through the second intermediate cooling pipe 405. The refrigeration station 303 is located in the second refrigerant storage tank 302.

A refrigerant in the cable cooling channel of the first transmission segment 401 enters the second refrigerant storage tank 302 through the inflow cooling pipe, and after being cooled by the refrigeration station 303, the refrigerant enters the cable cooling channel of the third transmission segment 407 through the outflow cooling pipe.

A refrigerant in the first refrigerant storage tank 301 enters the second refrigerant storage tank 302 through the first intermediate cooling pipe 406, and after being cooled by the refrigeration station 303, the refrigerant enters the first refrigerant storage tank 301 through the second intermediate cooling pipe 405.

Specifically, the refrigeration station 303 may use a refrigerator.

In this embodiment, the coolant circulation device includes the first refrigerant storage tank 301 and the second refrigerant storage tank 302, the first refrigerant storage tank 301 refrigerates the second transmission segment of the submarine superconducting cable segment, and a refrigerant medium in the cable cooling channel is cooled in the second refrigerant storage tank 302, so that refrigeration for a long-distance superconducting cable is implemented.

In an example embodiment, still referring to FIG. 3, the coolant circulation device further includes: a first temperature sensor 205, a first refrigerant pump 305, and a temperature control module. The first temperature sensor 205 and the first refrigerant pump 305 are both connected to the temperature control module.

The first temperature sensor 205 and the first refrigerant pump 305 are both disposed in the first refrigerant storage tank 301. The first temperature sensor 205 is configured to monitor a temperature of the refrigerant in the first refrigerant storage tank 301. The temperature control module is configured to control a pumping flow of the first refrigerant pump 305 based on the temperature of the refrigerant monitored by the first temperature sensor 205, to maintain the temperature of the refrigerant in the first refrigerant storage tank 301 in a specific temperature range (for example, 70 K to 77 K).

In this embodiment, the temperature of the refrigerant in the first refrigerant storage tank is controlled.

In an example embodiment, still referring to FIG. 3, the coolant circulation device further includes: a second temperature sensor 206. The second temperature sensor 206 is disposed in the second refrigerant storage tank 302. The second temperature sensor 206 and the refrigeration station 303 are both connected to the temperature control module.

The second temperature sensor 206 is configured to monitor a temperature of the refrigerant in the second refrigerant storage tank 302. The temperature control module is further configured to control power of the refrigeration station 303 based on the temperature of the refrigerant monitored by the second temperature sensor 206, to enable the temperature of the refrigerant in the second refrigerant storage tank 302 to be smaller than a specific temperature value.

In this embodiment, the temperature of the refrigerant in the second refrigerant storage tank is controlled.

In an example embodiment, still referring to FIG. 3, the coolant circulation device further includes: a first flow sensor 203, a second flow sensor 204, a second refrigerant pump 304, and a flow adjustment module. The first flow sensor 203 is disposed on the cable cooling channel of the first transmission segment 401. The second flow sensor 204 is disposed on the cable cooling channel of the third transmission segment 407. The second refrigerant pump 304 is disposed in the second refrigerant storage tank 302. The second flow sensor 204 and the second refrigerant pump 304 are both connected to the flow adjustment module.

The first flow sensor 203 is configured to monitor a refrigerant inflow flow of the cable cooling channel of the first transmission segment 401. The second flow sensor 204 is configured to monitor a refrigerant outflow flow of the cable cooling channel of the third transmission segment 407.

The flow adjustment module is configured to control a pumping flow of the second refrigerant pump 304 based on the refrigerant inflow flow, to balance the refrigerant inflow flow and the refrigerant outflow flow.

In this embodiment, a flow of the refrigerant in a cooling pipe in the submarine superconducting cable is controlled.

In an example embodiment, still referring to FIG. 3, the relay station system further includes: a monitoring protection and processing system 201 and a signal station 202. The signal station 202 is connected to the monitoring protection and processing system 201. The monitoring protection and processing system 201 is connected to the optical fiber 102 in the cable body.

The monitoring protection and processing system 201 is configured to receive an optical fiber signal sent by the cable body. The optical fiber signal is used to represent a working state of the submarine superconducting cable. The monitoring protection and processing system 201 performs disturbance monitoring, strain monitoring, temperature monitoring on the superconducting cable, assessment on a submarine cable carrying capacity, and identification and warning on a ship based on the optical fiber signal.

The signal station 202 is configured to feed back the optical fiber signal to a terminal or an adjacent relay station system. Specifically, the signal station 202 performs regeneration and amplification on the optical fiber signal, sends the optical signal to a nearby relay station system, and performs real-time on-line monitoring and feedback on a status of the superconducting cable.

In an example embodiment, still referring to FIG. 3, the shaft-type operation and maintenance platform 601 is provided with a first overhaul channel 608 and a second overhaul channel 610.

The first overhaul channel 608 is located below a sea surface 501; and the second overhaul channel 610 is located above the sea surface 501. The first overhaul channel 608 is used for an overhaul drone 603 (or a carried manned submersible) to overhaul an exterior and interior of the shaft-type operation and maintenance platform 601. The second overhaul channel 610 is used for operation and maintenance personnel to enter the shaft-type operation and maintenance platform for overhaul.

To facilitate maintenance of the maintenance personnel in the shaft-type operation and maintenance platform 601, a climbing ladder 611 is disposed at a position that is inside the shaft-type operation and maintenance platform 601 and that is close to an overhaul channel.

To help the overhaul drone 603 to enter the shaft-type operation and maintenance platform 601, the relay station system further includes a compartment. The compartment is disposed at the first overhaul channel 608. The compartment is used for the overhaul drone 603 to overhaul the interior of the shaft-type operation and maintenance platform 601.

The compartment includes: a first compartment 604 and a second compartment 605. A side of the second compartment 605 is connected to the first overhaul channel 608. A second gate 607 is disposed at a bottom of the second compartment 605, and a top of the first compartment 604 is connected to a bottom of the second compartment 605 through the second gate 607. A first gate 606 is disposed on a side of the first compartment 604, and the first gate 606 is used for the overhaul drone 603 to enter the first compartment 604.

In an example embodiment, still referring to FIG. 3, the inflow cooling pipe includes a first straight channel segment 402, a first curved channel segment, and a connection channel segment 403. The outflow cooling pipe includes a second straight channel segment 404 and a second curved channel segment.

The first straight channel segment 402 is connected to the first curved channel segment; the first curved channel segment is connected to the second curved channel segment; the second curved channel segment is connected to the second straight channel segment 404; the first curved channel segment and the second curved channel segment form a semicircular channel; and the first straight channel segment 402 is connected to the second refrigerant storage tank 302 through the connection channel segment 403.

The cable cooling channel of the first transmission segment 401 is connected to the first straight channel segment 402; and the second refrigerant storage tank 302 is connected to the cable cooling channel of the third transmission segment 407 through the second straight channel segment 404.

The first straight channel segment 402, the semicircular channel, and the second straight channel segment 404 form an inverted U-shaped cooling pipe.

In an example embodiment, still referring to FIG. 3, the coolant circulation device further includes: a first air valve 702 and a second air valve 703. The first air valve 702 is disposed on the first curved channel segment, and the second air valve 703 is disposed at a top of the second refrigerant storage tank 302.

The first air valve 702 is configured to adjust an air pressure in the first straight channel segment 402. The second air valve 703 is configured to adjust an air pressure in the second refrigerant storage tank 302. An objective of the air valve is to prevent damage to the pipe due to a sudden change in the pressure in the pipe in case of flow changes or not to affect a flow at a back end due to a change in the pressure in the pipe.

In an example embodiment, still referring to FIG. 3, the coolant circulation device further includes an energy dissipation orifice plate 704. The energy dissipation orifice plate 704 is disposed inside the second straight channel segment 404. Water hammer protection is provided by an energy dissipation orifice plate 704 when a positive/negative water hammer occurs in the first straight channel segment 402.

There are the following advantages in all above embodiments. The long-distance submarine superconducting cable can stably operate via the one relay station system disposed at the specific distance for the long-distance submarine superconducting cable. The operation and maintenance costs of the relay station system can be reduced via the shaft-type operation and maintenance platform 601 in the relay station system. The refrigeration station 303 can maintain the temperature of the refrigerant in the superconducting cable cooling channel. The coolant circulation device can adjust the pressure in the superconducting cable cooling channel and the flow of the refrigerant. The signal station 202 can comprehensively monitor the key parameters such as the cable performance, the temperature, and the pressure via the monitoring protection and processing system 201, performs regeneration and amplification processing on the monitoring signal, and feeds back the monitoring signal to the adjacent relay station system or the terminal. The operation and maintenance personnel enter the shaft-type operation and maintenance platform 601 through the overhaul channel for overhaul.

Figure 4:
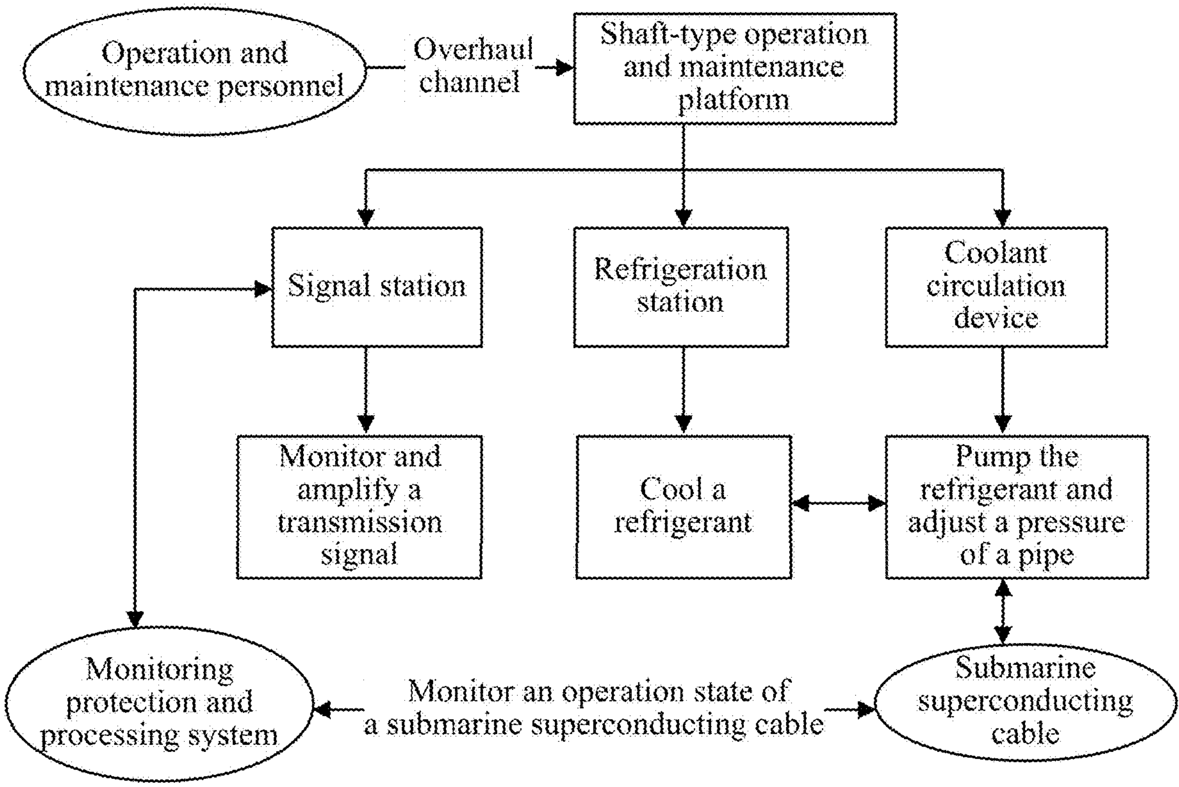
FIG. 4 is a schematic diagram of a work flow according to an embodiment of the present disclosure.

FIG. 4 is a schematic diagram of a work flow according to an embodiment of the present disclosure. As shown in FIG. 4, the following describes a specific work flow of the relay station system for a long-distance submarine superconducting cable.

The work flow mainly includes the following five steps.

Step 1: Place a shaft-type operation and maintenance platform 601 in an area in which a relay station for a submarine superconducting cable is located.

Step 2: Carry a refrigeration station 303, a coolant circulation device, and a signal station 202 in the shaft-type operation and maintenance platform 601.

Step 3: A cable cooling channel is connected to the coolant circulation device, to adjust a pressure of a pipe, and the refrigeration station 303 cools a refrigerant and then pumps the refrigerant to the cable cooling channel through the coolant circulation device.

Step 4: A monitoring protection and processing system 201 comprehensively monitors key parameters such as cable performance, a temperature, and a pressure, and the signal station 202 performs regeneration and amplification processing on a monitoring signal, and sends the monitoring signal to an adjacent relay station or a terminal.

Step 5: When a device or cable in the relay station fails, the operation and maintenance personnel enter a shaft through the overhaul channel for overhaul.

Specifically, as shown in FIG. 3, the cable core 101 and the optical fiber 102 are stripped in the first refrigerant storage tank 301 from a housing 104 of the cable, separated from the first transmission segment 401, and then connected to the third transmission segment 407.

A refrigerant 103 flows into the first straight channel segment 402 from the first transmission segment 401, and is maintained at a control fluid level 502, a flow of the refrigerant 103 is monitored by the first flow sensor 203, and the air pressure in the first straight channel segment 402 is adjusted by the first air valve 702.

Water hammer protection is provided by an energy dissipation orifice plate 704 when a positive/negative water hammer occurs in the first straight channel segment 402.

The refrigerant 103 flows to the second refrigerant storage tank 302 from the first straight channel segment 402 through the connection channel segment 403, and an air pressure of the second refrigerant storage tank 302 is adjusted by the second air valve 703.

A refrigerant 103 in the first refrigerant storage tank 301 is pumped to the second refrigerant storage tank 302 by the first refrigerant pump 305 through the first intermediate cooling pipe 406, and flows back to the first refrigerant storage tank 301 from the second refrigerant storage tank 302 through the second intermediate cooling pipe 405. A temperature of the refrigerant 103 is monitored by the first temperature sensor 205, and maintained in the specific temperature range (70 K to 77 K) by adjusting the pumping flow of the first refrigerant pump 305.

The refrigerant 103 in the second refrigerant storage tank 302 is pumped to the third transmission segment 407 by the second refrigerant pump 304 through the second straight channel segment 404. The temperature of the refrigerant 103 is monitored by the second temperature sensor 206, and reduced below the specific temperature value (70K) by adjusting the power of the refrigeration station 303.

The second flow sensor 204 monitors a flow of the refrigerant 103 passing through the third transmission segment 407, compares data of the first flow sensor 203 and data of the second flow sensor 204, adjusts the pumping flow of the second refrigerant pump 304, and keeps an inflow rate in the first transmission segment 401 and an outflow rate in the third transmission segment 407 balanced.

The monitoring protection and processing system 201 receives a signal of the optical fiber 102, and performs disturbance monitoring, strain monitoring, temperature monitoring on the superconducting cable, assessment on a submarine cable carrying capacity, and identification and warning on a ship 602.

The monitoring protection and processing system 201 performs regeneration and amplification on the signal through the signal station 202, sends the signal to a nearby relay station or terminal, and performs real-time on-line monitoring and feedback on a status of the superconducting cable.

A top of the shaft-type operation and maintenance platform 601 is slightly higher than the sea surface 501, and provided with the first overhaul channel 608 and the second overhaul channel 610 separately. The operation and maintenance personnel are transferred to a sea area near the shaft-type operation and maintenance platform 601 by the ship 602, and a small boat transferring the operation and maintenance personnel docks at the floating pontoon dock 609. The operation and maintenance personnel enter the interior of the shaft-type operation and maintenance platform 601 by using the climbing ladder 611 through the second overhaul channel 610 for overhaul.

The ship 602 launches an overhaul drone 603 to overhaul the exterior of the shaft-type operation and maintenance platform 601. After the overhaul on the exterior is completed, the overhaul drone 603 dives down to a position near the first compartment 604, the second gate 607 is closed, the first gate 606 is opened, the overhaul drone 603 enters the first compartment 604, the first gate 606 is closed, the second gate 607 is opened, and the overhaul drone 603 enters the second compartment 605, and then enters the shaft-type operation and maintenance platform 601 through the first overhaul channel 608 for overhaul.

In this embodiment, the refrigeration station is carried in the shaft-type operation and maintenance platform, the refrigerant in the superconducting cable cooling pipe is cooled through the coolant circulation device, and the pressure of the superconducting cable cooling pipeline and the flow of the refrigerant are adjusted. In addition, key parameters such as the cable performance, the temperature, and the pressure are comprehensively monitored through the monitoring protection and processing system, and the signal station performs regeneration and amplification processing on the monitoring signal, and feeds back the monitoring signal to the adjacent relay station or the terminal. When a device or a cable in a relay station fails, the operation and maintenance personnel enter a shaft through the overhaul channel for overhaul. According to the present disclosure, problems of transmission of an operation and monitoring signal of the long-distance submarine superconducting cable, circulation and cooling of the refrigerant in the superconducting cable, and adjustment on the pressure in the superconducting cable cooling pipe are resolved by the shaft-type operation and maintenance platform, so that a low-temperature environment is maintained for the long-distance cable. A designed structure of the relay station (the shaft-type operation and maintenance platform) facilitates operation and maintenance while completing a relay task, which facilitates the maintenance and repair of the relay station/cable, and resolving the operation and maintenance problems of the relay station of the superconducting cable, including facilitating maintenance for a superconducting cable laid under the seabed, facilitating refrigeration and circulation maintenance for the relay station, facilitating maintenance for other relay signal devices (for example, the optical fiber), and reducing overall operation and maintenance costs.

The technical features of the above embodiments can be employed in arbitrary combinations. To provide a concise description of these embodiments, all possible combinations of all the technical features of the above embodiments may not be described; however, these combinations of the technical features should be construed as falling within the scope defined by the specification as long as no contradiction occurs.

Specific examples are used herein to explain the principles and implementations of the present disclosure. The description of the embodiments is merely intended to help understand the method of the present disclosure and its core ideas. In addition, those of ordinary skill in the art can make various modifications to the specific implementations and application scope in accordance with the teachings of the present disclosure. In conclusion, the content of the specification shall not be construed as limitations to the present disclosure.

What is claimed is:

1. A relay station system for a long-distance submarine superconducting cable, wherein the relay station system is used for a submarine superconducting cable;

the submarine superconducting cable comprises a housing and a cable body that is disposed in the housing; a cable cooling channel is disposed between the housing and the cable body; the cable cooling channel is configured to introduce a refrigerant; relay station systems are provided and spaced apart at a specific distance for the submarine superconducting cable; one of the relay station systems corresponds to a segment of the submarine superconducting cable; a housing of the segment of the submarine superconducting cable is partially stripped, to form a first transmission segment, a second transmission segment, and a third transmission segment; and the second transmission segment is the segment of the submarine superconducting cable of which the housing is stripped;

the relay station system comprises: a shaft-type operation and maintenance platform, a refrigeration station, and a coolant circulation device; and the refrigeration station and the coolant circulation device are carried inside the shaft-type operation and maintenance platform;

the coolant circulation device comprises: an inflow cooling pipe, an outflow cooling pipe, a first refrigerant storage tank, a second refrigerant storage tank, a first intermediate cooling pipe, and a second intermediate cooling pipe;

the first refrigerant storage tank is located outside the second transmission segment; the first refrigerant storage tank is configured to provide the refrigerant for the second transmission segment; the first refrigerant storage tank is connected to an input of the second refrigerant storage tank through the first intermediate cooling pipe; a cable cooling channel of the first transmission segment is connected to the inflow cooling pipe; the inflow cooling pipe is connected to the second refrigerant storage tank; the second refrigerant storage tank is connected to a cable cooling channel of the third transmission segment through the outflow cooling pipe; the second refrigerant storage tank is connected to the first refrigerant storage tank through the second intermediate cooling pipe; and the refrigeration station is located in the second refrigerant storage tank;

a refrigerant in the cable cooling channel of the first transmission segment enters the second refrigerant storage tank through the inflow cooling pipe, and after being cooled by the refrigeration station, the refrigerant enters the cable cooling channel of the third transmission segment through the outflow cooling pipe; and a refrigerant in the first refrigerant storage tank enters the second refrigerant storage tank through the first intermediate cooling pipe, and after being cooled by the refrigeration station, the refrigerant enters the first refrigerant storage tank through the second intermediate cooling pipe.

2. The relay station system according to claim 1, wherein the coolant circulation device further comprises: a first temperature sensor, a first refrigerant pump, and a temperature control module; and the first temperature sensor and the first refrigerant pump are both connected to the temperature control module;

the first temperature sensor and the first refrigerant pump are both disposed in the first refrigerant storage tank; and the first temperature sensor is configured to monitor a temperature of the refrigerant in the first refrigerant storage tank; and the temperature control module is configured to control a pumping flow of the first refrigerant pump based on the temperature of the refrigerant monitored by the first temperature sensor, to maintain the temperature of the refrigerant in the first refrigerant storage tank in a specific temperature range.

3. The relay station system according to claim 2, wherein the coolant circulation device further comprises: a second temperature sensor; the second temperature sensor is disposed in the second refrigerant storage tank; and the second temperature sensor and the refrigeration station are both connected to the temperature control module; and the second temperature sensor is configured to monitor a temperature of the refrigerant in the second refrigerant storage tank; and the temperature control module is further configured to control power of the refrigeration station based on the temperature of the refrigerant monitored by the second temperature sensor, to enable the temperature of the refrigerant in the second refrigerant storage tank to be smaller than a specific temperature value.

4. The relay station system according to claim 1, wherein the coolant circulation device further comprises: a first flow sensor, a second flow sensor, a second refrigerant pump, and a flow adjustment module; the first flow sensor is disposed on the cable cooling channel of the first transmission segment; the second flow sensor is disposed on the cable cooling channel of the third transmission segment; the second refrigerant pump is disposed in the second refrigerant storage tank; and the second flow sensor and the second refrigerant pump are both connected to the flow adjustment module;

the first flow sensor is configured to monitor a refrigerant inflow flow of the cable cooling channel of the first transmission segment; and the second flow sensor is configured to monitor a refrigerant outflow flow of the cable cooling channel of the third transmission segment; and the flow adjustment module is configured to control a pumping flow of the second refrigerant pump based on the refrigerant inflow flow, to balance the refrigerant inflow flow and the refrigerant outflow flow.

5. The relay station system according to claim 1, wherein the relay station system further comprises: a monitoring protection and processing system and a signal station; the signal station is connected to the monitoring protection and processing system; and the monitoring protection and processing system is connected to the cable body; and the monitoring protection and processing system is configured to receive an optical fiber signal sent by the cable body; and the signal station is configured to feed back the optical fiber signal to a terminal or an adjacent relay station system.

6. The relay station system according to claim 1, wherein the shaft-type operation and maintenance platform is provided with a first overhaul channel and a second overhaul channel; the first overhaul channel is located below a sea surface; and the second overhaul channel is located above the sea surface;

the first overhaul channel is used for an overhaul drone to overhaul an exterior and interior of the shaft-type operation and maintenance platform; and the second overhaul channel is used for operation and maintenance personnel to enter the shaft-type operation and maintenance platform for overhaul.

7. The relay station system according to claim 1, wherein the inflow cooling pipe comprises a first straight channel segment, a first curved channel segment, and a connection channel segment; and the outflow cooling pipe comprises a second straight channel segment and a second curved channel segment;

the first straight channel segment is connected to the first curved channel segment; the first curved channel segment is connected to the second curved channel segment; the second curved channel segment is connected to the second straight channel segment; the first curved channel segment and the second curved channel segment form a semicircular channel; and the first straight channel segment is connected to the second refrigerant storage tank through the connection channel segment; and the cable cooling channel of the first transmission segment is connected to the first straight channel segment; and the second refrigerant storage tank is connected to the cable cooling channel of the third transmission segment through the second straight channel segment.

8. The relay station system according to claim 7, wherein the coolant circulation device further comprises: a first air valve and a second air valve;

the first air valve is disposed on the first curved channel segment, and the second air valve is disposed at a top of the second refrigerant storage tank; and the first air valve is configured to adjust an air pressure in the first straight channel segment; and the second air valve is configured to adjust an air pressure in the second refrigerant storage tank.

9. The relay station system according to claim 7, wherein the coolant circulation device further comprises: an energy dissipation orifice plate; and the energy dissipation orifice plate is disposed inside the second straight channel segment.

10. The relay station system according to claim 6, wherein the relay station system further comprises: a compartment; the compartment is disposed at the first overhaul channel; and the compartment is used for the overhaul drone to overhaul the exterior and interior of the shaft-type operation and maintenance platform.

* * * * *